United States Patent [19]

Ogawa

[11] Patent Number: 5,463,363
[45] Date of Patent: Oct. 31, 1995

[54] MAGNETIC FIELD CORRECTION DEVICE WITH SLOTTED PASSIVE SHIMS

[75] Inventor: Kouichi Ogawa, Ako, Japan

[73] Assignee: Mitsubishi Denki Kabushiki Kaisha, Tokyo, Japan

[21] Appl. No.: 330,615

[22] Filed: Oct. 28, 1994

Related U.S. Application Data

[63] Continuation of Ser. No. 67,118, May 26, 1993, abandoned.

[30] Foreign Application Priority Data

May 29, 1992 [JP] Japan .................... 4-138148

[51] Int. Cl.⁶ .............. H01F 5/00; H01F 3/00; G01V 3/00
[52] U.S. Cl. .............. 335/299; 335/298; 324/320
[58] Field of Search .............. 335/216, 296, 335/299, 301, 304, 306, 297, 298; 324/319, 320

[56] References Cited

U.S. PATENT DOCUMENTS

| | | | |
|---|---|---|---|
| 4,206,383 | 6/1980 | Anicich | 313/362 |
| 4,723,116 | 2/1988 | Muller | 335/296 |
| 4,743,853 | 5/1988 | Frese . | |
| 4,803,433 | 2/1989 | McBride | 324/318 |
| 4,879,538 | 11/1989 | Pausch | 335/298 |
| 5,003,266 | 3/1991 | Palkovich et al. . | |
| 5,063,934 | 11/1991 | Rapoport | 128/653.5 |
| 5,194,810 | 3/1993 | Breneman | 324/319 |
| 5,229,723 | 7/1993 | Sakurai | 324/319 |
| 5,235,284 | 8/1993 | Tahara et al. . | |

*Primary Examiner*—Leo P. Picard
*Assistant Examiner*—Stephen J. Ryan
*Attorney, Agent, or Firm*—Sughrue, Mion, Zinn, Macpeak & Seas

[57] ABSTRACT

A magnetic field correction device for enhancing magnetic uniformity of the field generated by a magnet includes plate-shaped shim elements provided with slots or holes for generating a desired corrective field component (the $Bz^{11}$, the $Bz^{21}$, or the $Bz^{22}$ component). Thus, the shim elements exhibit the same length, thickness and width, and hence can be bundled easily together.

10 Claims, 4 Drawing Sheets

MAGNETIC FIELD CORRECTION DEVICE WITH SLOTTED PASSIVE SHIMS

This is a continuation of application Ser. No. 08/067,118 filed May 26, 1993 now abandoned.

BACKGROUND OF THE INVENTION

This invention relates to magnetic field correction devices (i.e., passive shim arrangements) for correcting the magnetic field generated by a magnet for producing a uniform field in magnetic resonance imaging devices, etc.

Generally, the magnets for producing a uniform magnetic field are designed to generate a homogeneous field by itself. However, due to errors in workmanship and effects of adjacent iron bodies, it is difficult to attain the designed level of magnetic field uniformity. Thus, a magnetic field correction device, i.e., passive shim arrangement, is provided in the magnet for compensating for the errors in workmanship and effects of the iron bodies.

FIG. 8 is a perspective view of a conventional magnet for generating a uniform magnetic field. A magnet casing 1 accommodates a solenoid coil (not shown) for generating a homogeneous magnetic field within the magnet casing 1. Magnetic shim elements 2 are fixed upon the interior of the casing 1 by means of attachment jigs 3, and corrects the inhomogeneity of the field within the uniform field region 4. In what follows, the positions of the shim elements 2 are specified with respect to the coordinate axes 5.

FIGS. 9a and 9b are a perspective and an end view, respectively, of a single magnetic bar, showing the positional parameters thereof with respect to the coordinate axes. Generally, as described in detail below, two bars as shown in FIGS. 9a and 9b of distinct lengths are soldered to each other to form a magnetic shim element 2.

The bar 9 is axially aligned with the Z-axis. The magnetic bar 9 is magnetized by means of the external magnetic field 8 along the Z-axis. As a result, magnetic charges appear at the end surfaces 10 and 11, such that a correction field 12 is generated. The magnetic shim elements 2 each consisting of two magnetic bars 9 of appropriate dimensions thus obtained are disposed at appropriate positions upon the interior of the magnet casing 1, such that the non-homogeneity of the magnetic field within the magnetic field region 4 is corrected.

Next, the correction field 12 generated by a magnetic bar 9 is described in detail. The magnetic bar 9 is disposed parallel to the Z-axis at a circumferential attachment angle $\phi$ and an attachment radius a (see FIG. 9b), such that the end surfaces of the magnetic bar 9 form end angles $\alpha 1$ and $\alpha 2$ with respect to the origin and the Z-axis (see FIG. 9a). The point P at which the field is measured is positioned at a radius r which form an angle $\Phi$ with respect to the X-axis (see FIG. 9b) and angle $\theta$ with respect to the Z-axis (see FIG. 9b).

Then, the magnetic field Bz formed by the magnetic bar 9 at measurement point P is given by equation (1):

$$B_z^{nm} = -K(1/A^2) \sum_{n=0}^{\infty} \sum_{m=0}^{n} \epsilon_m \frac{(n-m+1)!}{(n+m)!} [P_{n+1}^m(\cos\alpha)\sin^{n+2}\alpha]_{\alpha 1}^{\alpha 2} \times (r/a)^n P_n^m(\cos\theta) \times \cos m(\Phi - \phi) \quad (1)$$

where K is a constant determined by the magnetic charac-teristic of the magnetic bar 9, A is the cross-sectional area of the magnetic bar 9, $\epsilon_m$ is the Neumann coefficient ($\epsilon_m=2$ if $m \neq 0$ and $\epsilon_m=1$ if $m=0$), and $P_n^m$ is the associated Legendre polynomial of degree n and order m.

Further, the following TABLE 1 shows the correspondence between the output components of the magnetic field in the spherical polar coordinates $Bz^{nm}$ (up to n=2) and the cartesian components expressed in the orthogonal coordinate system X, Y, Z.

TABLE 1

| (CORRESPONDENCE UP TO n = 2) | | |
|---|---|---|
| n | m | COMPONENTS IN ORTHOGONAL COORDINATES |
| 1 | 0 | Z |
| 1 | 1 | X or Y |
| 2 | 0 | $Z^2$ |
| 2 | 1 | ZX or ZY |
| 2 | 2 | $X^2 - Y^2$ or XY |

As seen from equation (1), the number of the magnetic components generated by the magnetic bar 9 is infinite. However, since generally a>r holds, the factor $(r/a)^n$ becomes negligibly small for those terms for which the value of n is great. Thus, it suffices to consider the components for which the values of n and m are small: $Bz^{11}$, $Bz^{21}$, $Bz^{22}$, $Bz^{31}$, $Bz^{32}$, $Bz^{33}$, $Bz^{41}$, $Bz^{42}$, $Bz^{43}$, $Bz^{44}$, $Bz^{51}$, $Bz^{52}$, $Bz^{53}$, $Bz^{54}$. Thus, for example, the dimensions and position of the bar 9 which generate only the $Bz^{11}$ component corresponding to the X-component are determined as described below in the paragraphs (i), (ii), and (iii), in accordance with the method described in Japanese Laid-Open Patent Application (Kokai) No. 3-39676.

(i) The magnetic bars are attached at eight circumferential attachment angles $\phi$ as given by equations (a) through (h):

$$\phi=(\pi/2)((\tfrac{1}{2})+(\tfrac{1}{3})+(\tfrac{1}{4})) \quad (a)$$

$$\phi=(\pi/2)((\tfrac{1}{2})+(\tfrac{1}{3})-(\tfrac{1}{4})) \quad (b)$$

$$\phi=(\pi/2)((\tfrac{1}{2})-(\tfrac{1}{3})+(1/4)) \quad (c)$$

$$\phi=(\pi/2)((\tfrac{1}{2})-(\tfrac{1}{3})-(1/4)) \quad (d)$$

$$\phi=(\pi/2)(-(\tfrac{1}{2})+(\tfrac{1}{3})+(1/4)) \quad (e)$$

$$\phi=(\pi/2)(-(\tfrac{1}{2})+(\tfrac{1}{3})-(1/4)) \quad (f)$$

$$\phi=(\pi/2)(-(\tfrac{1}{2})-(\tfrac{1}{3})+(1/4)) \quad (g)$$

$$\phi=(\pi/2)(-(\tfrac{1}{2})-(\tfrac{1}{3})-(1/4)) \quad (h)$$

such that the factor: $\cos m(\Phi-\phi)$ for m=2, 3, 4 vanishes and thus the components: $Bz^{22}$, $Bz^{32}$, $Bz^{33}$, $Bz^{42}$, $Bz^{43}$, $Bz^{44}$, $Bz^{52}$, $Bz^{53}$, and $Bz^{54}$ vanish.

(ii) The end angles $\alpha 1$ and $\alpha 2$ of each magnetic bar 9 are selected such that they satisfy: $\alpha 2=\pi-\alpha 1$. Then, the following equations (2a) and (2b) hold and the components $Bz^{21}$ and $Bz^{41}$ vanish:

$$[P_3^1(\cos\alpha) \sin^4\alpha]_{\pi-\alpha 1}^{\alpha 1}=0 \quad (2a)$$

$$[P_5^1(\cos\alpha) \sin^6\alpha]_{\pi-\alpha 1}^{\alpha 1}=0 \quad (2b)$$

Further, by selecting the end angles $\alpha 1$ and $\alpha 2$ of the two magnetic bars 9 at 33.88° and 146.12°, respectively, and at 62.04° and 117.96°, respectively, the components $Bz^{51}$ of the two magnetic bars constituting a shim element are both eliminated.

(iii) Assume that the cross-sectional area of the magnetic bar 9 having end angles $\alpha 1$ and $\alpha 2$ at 33.88° and 146.12° respectively, and that of the magnetic bar 9 having end angles α1, α2 at 62.04° and 117.96° respectively, are represented by A1 and A2, respectively. Then the resultant component $Bz^{31}$ of the two magnetic bars 9 is given by:

$$Bz^{31} \propto A1\{P_4^1 (\cos 33.88°)(\sin 33.88°)^5\} + A2\{P_4^1 (\cos 62.04°)(\sin 62.04°)^5\}$$

Thus, by selecting the ratio A1/A2 at 7.16 as shown by the following equation (3), the component $Bz^{31}$ vanishes.

$$\frac{A_1}{A_2} = \frac{P_4^1(\cos 33.88°) \cdot (\sin 33.88°)^5}{P_4^1(\cos 62.04°) \cdot (\sin 62.04°)^5} = 7.16 \qquad (3)$$

Thus, as shown in FIG. 10, a bar 13 having end angles 33.88° and 146.12° and a bar 14 having end angles 62.4° and 117.96° are soldered to each other by means of solder 15 to form a single shim element 2. The shim elements 2 are attached to the casing 3 so that the conditions (i), (ii), and (iii) are satisfied. Thus, the components other than the desired $Bz^{11}$ is eliminated and only the negative X-component field is generated.

The above description relates to the shim elements for generating the $Bz^{11}$ components. The shim elements for generating the $Bz^{21}$ and the $Bz^{22}$ components can be obtained in a similar manner. The ratio of the cross sectional areas A1/A2 of the two magnetic bars constituting a shim element and the two end angles α1 and α2 thereof for generating the $Bz^{11}$, $Bz^{21}$, and $Bz^{22}$ components, respectively, are summarized in the following TABLE 2.

TABLE 2

| components | ratio of area ($A_1/A_2$) | end angles ($α_1$ & $α_2$) |
| --- | --- | --- |
| $B_z^{11}$ | 7.16 | (33.88°, 146.12°) |
|  |  | (62.04°, 117.96°) |
| $B_z^{21}$ | 1.25 | (40.09°, 106.57°) |
|  |  | (40.09°, 73.43°) |
| $B_z^{22}$ | 5.47 | (36.69°, 140.31°) |
|  |  | (65.11°, 114.89°) |

The conventional magnetic field correction device as described above, however, has the following disadvantages:

(1) Since the each shim element consists of two magnetic bars 13 and 14, the cross sectional form of the shim element varies along its length. Thus, when a plurality of shim elements for generating the same magnetic component are bundled together, the effective volume occupied by the magnetic bars is reduced and hence the space is used ineffectively.

(2) The assembly of the shim elements requires the soldering of two magnetic bars at a precise relative position. This assembly step is time consuming.

(3) As shown in TABLE 2, the end angles α1 and α2 for respective field components are different from each other. Thus, it is difficult to combine the shim elements for generating different field components together.

SUMMARY OF THE INVENTION

It is therefore an object of this invention to provide a magnetic field correction device by which: (1) a plurality of magnetic shim elements for the same field component can be bundled together without reducing the effective volume of the space occupied by the shim elements; (2) the step of fixing the two magnetic bars to each other by means of solder, etc., can be dispensed with, such that the assembly procedure can be facilitated; and (3) the magnetic shim elements for generating different magnetic components can be easily combined and bundled together, such that any combination of corrective field components can be generated without difficulty.

The above object is accomplished in accordance with this invention by a magnetic field correction device for enhancing a uniformity of a magnetic field generated in a uniform field region by a magnet, which device comprises: a plurality of plate-shaped magnetic shim elements disposed parallel to each other at a predetermined radius from a center of the uniform field region and at predetermined circumferential angles around the center, wherein the shim elements are each provided with at least one hole such that a predetermined corrective field component is generated by the shim elements in the uniform field region. Preferably, the plate-shaped shim elements have equal length, thickness and width such that they can easily be bundled together.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

FIG. 1b shows the dimensional and positional parameters of the shim element of FIG. 1a;

FIG. 4b is a sectional view of the shim element of FIG. 4a;

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1A:
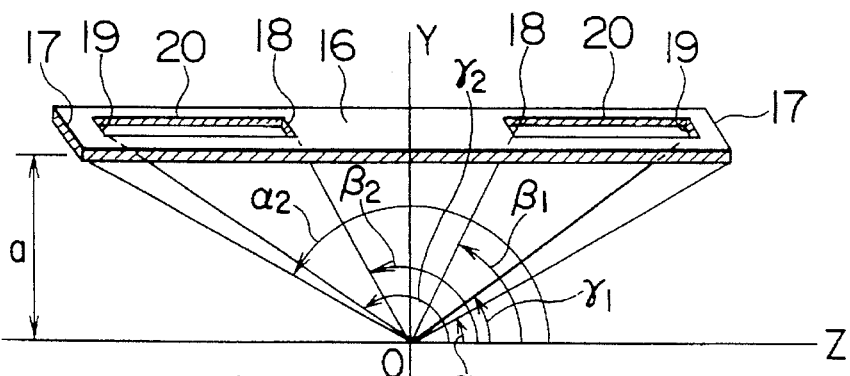
FIG. 1a shows a perspective view of a shim element according to this invention in relation to the coordinate axes.
Figure 1B:
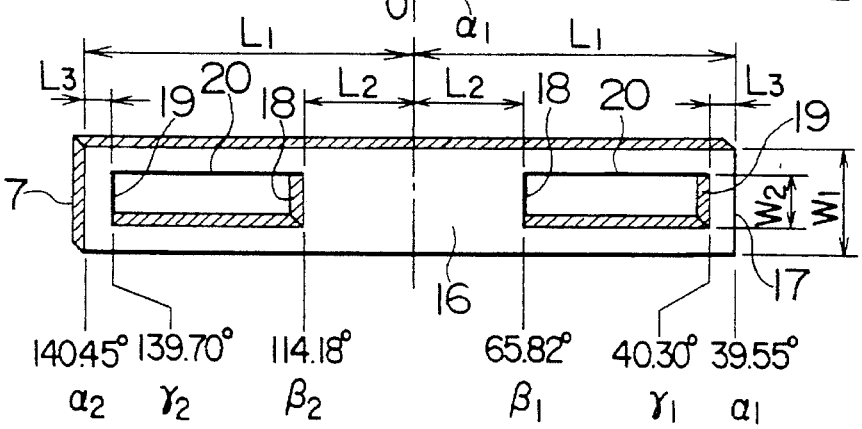

FIG. 1a shows a perspective view of a shim element according to this invention in relation to the coordinate axes. FIG. 1b shows the dimensional and positional parameters of the shim element of FIG. 1a. The two figures illustrates a magnetic shim element 16 having through-holes or slots 20 for generating negative X-component. The plate-shaped magnetic shim element 16 is machined to form a pair of slots 20 disposed symmetrically with respect to the central plane (the X-Y plane) thereof. The dimensions and position of the shim elements 16 for generating the $Bz^{11}$ component are determined as follows.

(i) Eight shim elements 16 are attached at circumferential angles $\pi/2(\pm\frac{1}{2}\pm\frac{1}{3}\pm\frac{1}{4})$:

$$\phi=(\pi/2)((\tfrac{1}{2})+(\tfrac{1}{3})+(\tfrac{1}{4})) \quad (a)$$

$$\phi=(\pi/2)((\tfrac{1}{2})+(\tfrac{1}{3})-(\tfrac{1}{4})) \quad (b)$$

$$\phi=(\pi/2)((\tfrac{1}{2})-(\tfrac{1}{3})+(\tfrac{1}{4})) \quad (c)$$

$$\phi=(\pi/2)((\tfrac{1}{2})-(\tfrac{1}{3})-(\tfrac{1}{4})) \quad (d)$$

$$\phi=(\pi/2)(-(\tfrac{1}{2})+(\tfrac{1}{3})+(\tfrac{1}{4})) \quad (e)$$

$$\phi=(\pi/2)(-(\tfrac{1}{2})+(\tfrac{1}{3})-(\tfrac{1}{4})) \quad (f)$$

$$\phi=(\pi/2)(-(\tfrac{1}{2})-(\tfrac{1}{3})+(\tfrac{1}{4})) \quad (g)$$

$$\phi=(\pi/2)(-(\tfrac{1}{2})-(\tfrac{1}{3})-(\tfrac{1}{4})) \quad (h)$$

such that the factor $\cos m(\Phi-\phi)$ for $m=2, 3, 4$ in equation (1) vanishes and thus the components: $Bz^{22}$, $Bz^{32}$, $Bz^{33}$, $Bz^{42}$, $Bz^{43}$, $Bz^{44}$, $Bz^{52}$, $Bz^{53}$, and $Bz^{54}$ vanish.

(ii) The two end surfaces of the magnetic shim element 16 form end angles $\alpha1$ and $\alpha2$ with respect to the Z-axis. On the other hand, the inner end surfaces 18 of the slots 20 form angles $\beta1$ and $\beta2$, and the outer end surfaces 19 of the slots 20 form angles $\gamma1$ and $\gamma2$, respectively, with respect to the Z-axis (see FIGS. 1a and 1b). Magnetic charge is thus induced at these end surfaces at angles $\alpha1$, $\alpha2$, $\beta1$, $\beta2$, $\gamma1$, and $\gamma2$. For the magnetic field generated by the magnetic charges at end angles $\beta1$ and $\beta2$, the same equation as the above equation (1) holds, wherein $\alpha1$ and $\alpha2$ are replaced by $\beta1$ and $\beta2$, respectively. With respect to the magnetic field generated by the magnetic charge at end angles $\gamma1$ and $\gamma2$, the sign of the equation (1) is reversed, $\alpha1$ and $\alpha2$ being replaced by $\gamma1$ and $\gamma2$, respectively. It is assumed that the difference between the end angles $\alpha1$ and $\gamma1$ or between the end angles $\alpha2$ and $\gamma2$ is sufficiently small. Then the effect of the magnetic charge appearing at surface 19 at end angle $\gamma1$ (or $\gamma2$) are counterbalanced by that of the magnetic charge appearing at the corresponding area of the end surface 17 at end angle $\alpha1$ (or $\alpha2$).

The end angles $\alpha1$, $\alpha2$ $\beta1$, $\beta2$ of each magnetic shim element 16 are selected such that they satisfy: $\alpha2=\pi-\alpha1$, and $\beta2=\pi-\beta1$. Thus, the above equations (2a) and (2b), or the corresponding equations by which $\alpha1$ is replaced by $\beta1$, hold, and hence the components $Bz^{21}$ and $Bz^{41}$ vanish.

Further, taking into consideration of the end angles for generating different field components shown in TABLE 2, the end angles $\alpha1$ and $\beta1$ are selected at 39.55° and 65.82°, respectively, to minimize the $Bz^{51}$ component. Although this selection of the end angles does not eliminate the $Bz^{51}$ component, it can be reduced to a negligible level which has no adverse effects upon the field correction. The length L1 and L2 of the magnetic shim element 16, as represented in FIG. 1b, are calculated from the end angles $\alpha1$, $\alpha2$, $\beta1$, and $\beta2$ and the attachment radius a.

(iii) The cross sectional area of the end surfaces 17, 18, and 19 corresponding to end angles $\alpha1$ (or ($\alpha2$)), $\beta1$ (or $\beta2$), and $\gamma1$ (or $\gamma2$) are represented by A1, A2, and A3, respectively. It is noted that A2=A3 holds. Thus, the $Bz^{31}$ component can be reduced to zero by selecting the ratio of the cross sectional areas A1 and A2 as:

$$\frac{A_1}{A_2} = \frac{P_4^1(\cos 65.82)\cdot(\sin 65.82)^5 + P_4^1(\cos 40.3)\cdot(\sin 40.3)^5}{P_4^1(\cos 39.55)\cdot(\sin 39.55)^5} = 8.12 \quad (4)$$

Then, assuming that the thickness of the magnetic shim element is constant, the ratio of the width W1 of the shim 16 to and the width W2 of the slots 20 (see in FIG. 1b) is determined from equation (4), such that:

$$W1/W2=8.12$$

On the other hand, the end angles $\gamma1$ and $\gamma2$ of the end surface 18 are determined by the length L3, which is designed at a small value to which the magnetic shim element 16 can safely be machined and which offers a sufficient mechanical strength. In the case of this embodiment, the end angles $\gamma1$ and $\gamma2$ are selected at 40.3° and 139.70°, respectively.

Figure 3:
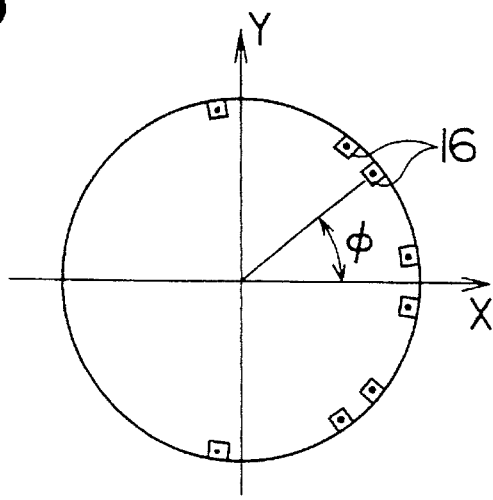
FIG. 3 shows the circumferential angle φ of the magnetic shim element.

The magnetic shim element 16 are attached at the eight circumferential angles $\phi$ (with respect to the X-axis, as shown schematically in FIG. 3), to generate corrective magnetic field in the negative X-component.

By using the shim elements 16 provided with the slots 20 as described above, the shim elements 16 for the same field component can be bundled together efficiently without reducing the effective volume occupied by the shim elements 16. Further, the step of fixing the magnetic bars together by means of the solder, for example, can be dispensed with, and hence the assembly is facilitated. Furthermore, the length, thickness and width of the plate-shaped shim elements for generating different field components may be equalized, such that the shim elements 16 for generating different field components can also be bundled together.

Figure 2A:
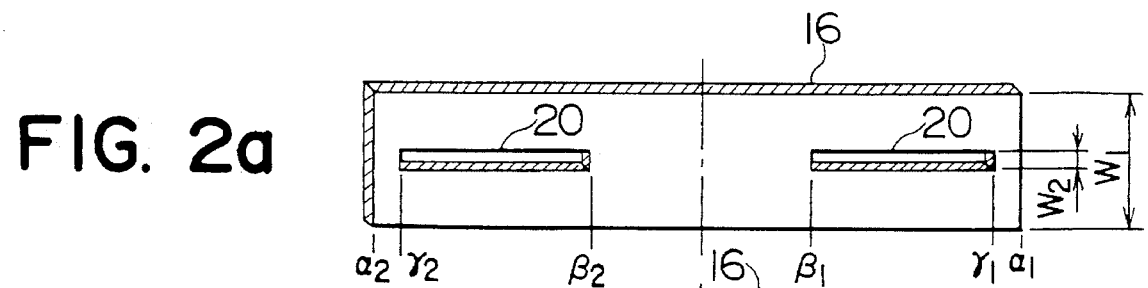
FIG. 2a shows the parameters listed in TABLE 3 for a shim element for the $Bz^{11}$ component according to this invention.
Figure 2B:
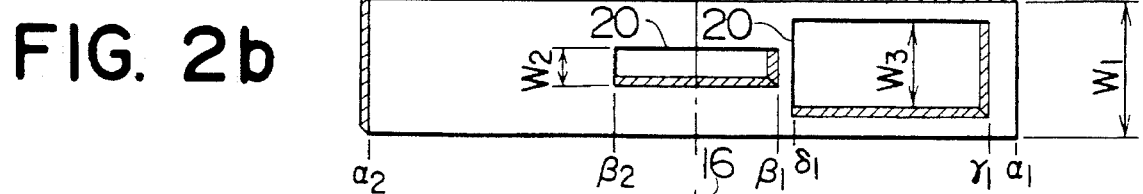
FIG. 2b shows the parameters listed in TABLE 3 for a shim element for the $Bz^{21}$ component according to this invention.
Figure 2C:
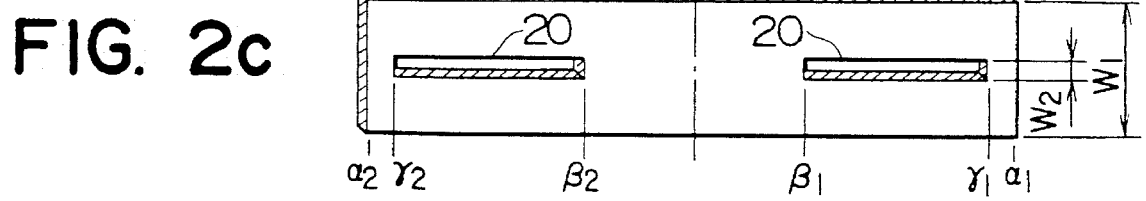
FIG. 2c shows the parameters listed in TABLE 3 for a shim element for the $Bz^{22}$ component according to this invention.

The above description relates to the shim elements 16 for generating the $Bz^{11}$ component. The shim elements for generating the $Bz^{21}$ and the $Bz^{22}$ components can also be prepared in a similar manner. FIGS. 2a, 2b, and 2c show the forms of the shim elements for generating the $Bz^{11}$, the $Bz^{21}$, and the $Bz^{22}$ components, respectively, together with the dimensional and positional parameters listed in the following TABLE 3.

TABLE 3

| comp. | end angles (deg) | | | | ratio of areas | | FIG. |
| --- | --- | --- | --- | --- | --- | --- | --- |
| | $\alpha_1$ | $\beta_1$ | $\gamma_1$ | $\delta_1$ | $W_1/W_2$ | $W_3/W_4$ | |
| $B_z^{11}$ | 39.55° | 65.82° | 40.30° | — | 8.12 | — | FIG. 2a |
| $B_z^{21}$ | 39.55° | 72.7° | 40.30° | 71.5° | 3.54 | 2.54 | FIG. 2b |
| $B_z^{22}$ | 39.55° | 65.82° | 40.30° | — | 6.89 | — | FIG. 2c |

The end angles $\alpha1$, $\alpha2$, $\beta1$, $\beta2$, $\gamma1$, $\gamma2$, and $\delta1$ are shown in FIGS. 2a through 2c. It is noted that the magnetic shim element 16 for generating the $B_z^{21}$ component is asymmetrical with respect to the central plane thereof (the X-Y plane). For the angles α1, α2, β1, β2, γ1, and γ2 the following relations hold:

$$\alpha 2 = \pi - \alpha 1$$

$$\beta 2 = \pi - \beta 1$$

$$\gamma 2 = \pi - \gamma 1$$

Figure 4A:
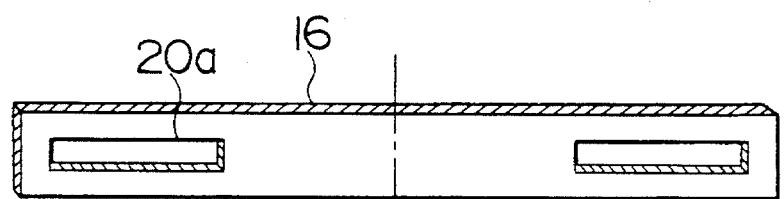
FIG. 4a is a perspective view of a shim element according to another embodiment of this invention.
Figure 4B:
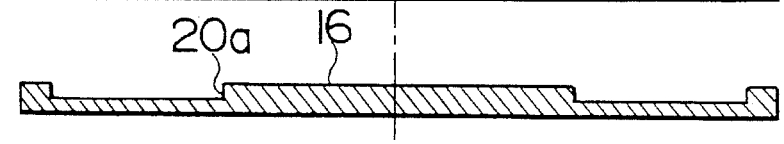
Figure 5:
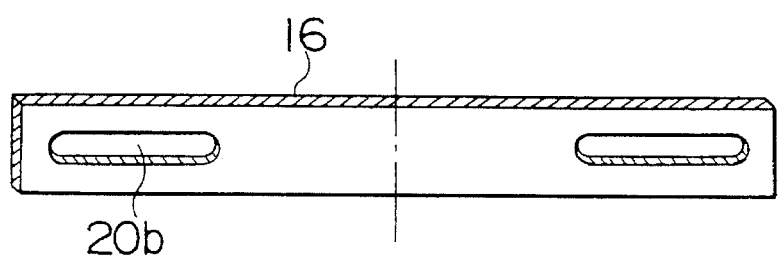
FIG. 5 is a perspective view of a shim element according to still another embodiment of this invention.
Figure 6:
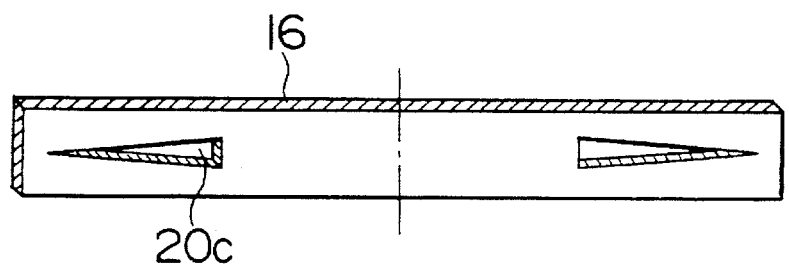
FIG. 6 is a perspective view of a shim element according to a further embodiment of this invention.
Figure 7:
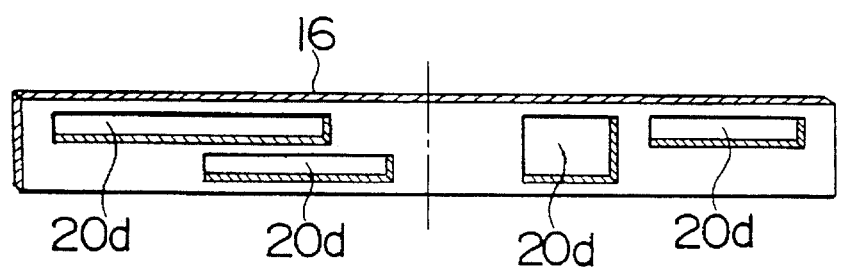
FIG. 7 is a perspective view of a shim element according to a still further embodiment of this invention.
Figure 8:
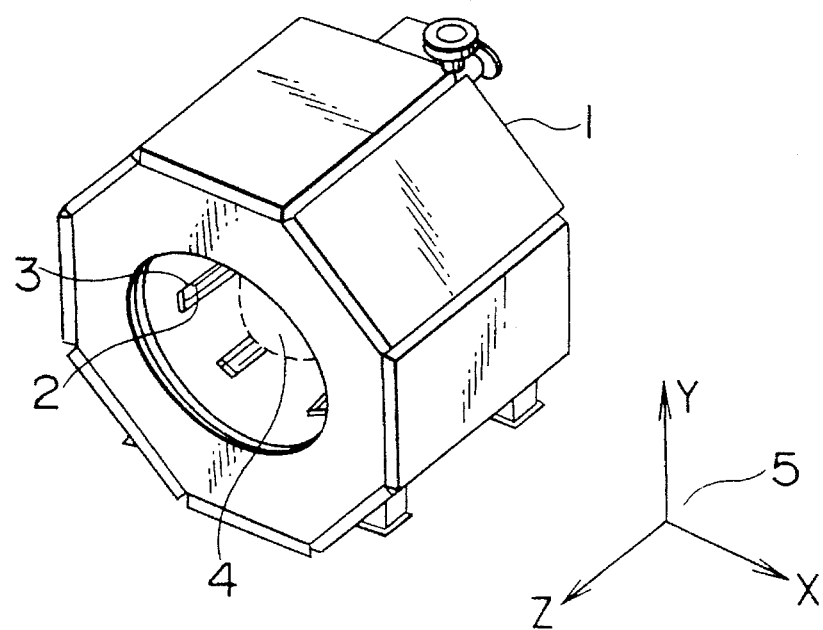
FIG. 8 is a perspective view of a conventional magnet for generating a uniform magnetic field.
Figure 9A:
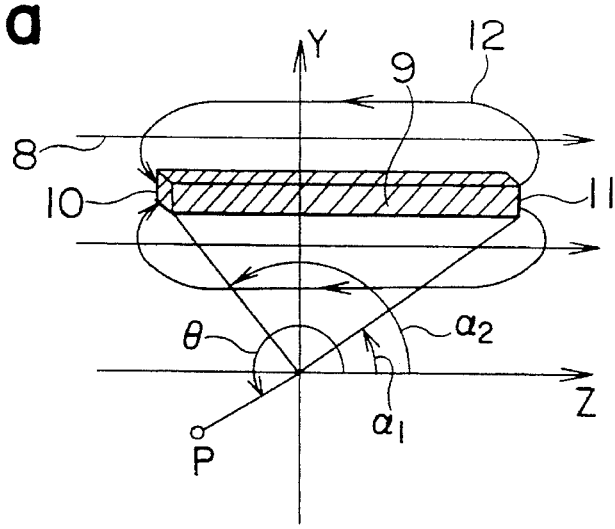
FIG. 9a is a perspective view of a single magnetic bar shown with the coordinate axes.
Figure 9B:
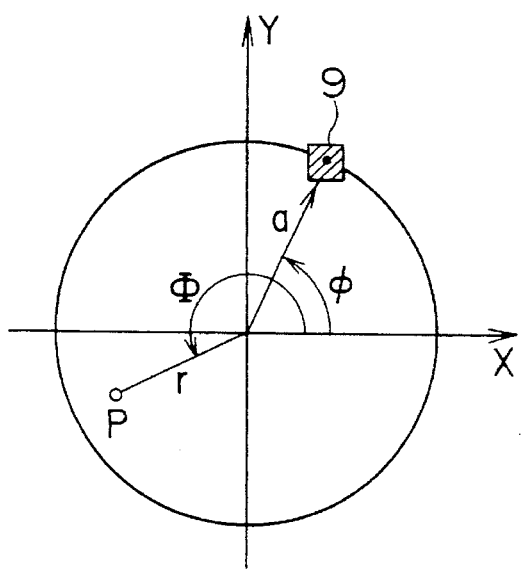
FIG. 9b is an end view of a single magnetic bar shown with the coordinate axes.
Figure 10:
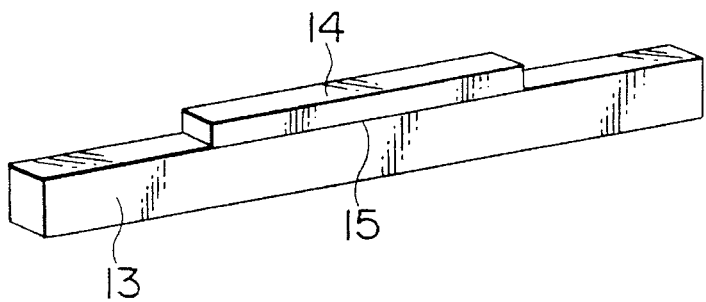
FIG. 10 is a perspective view of a conventional shim element consisting of two magnetic bars.

In the case of the above embodiments shown in FIG. 1 and FIGS. 2a through 2c, the magnetic shim element 16 is provided with slots or through-holes 20. As shown in FIGS. 4a and 4b, however, the magnetic shim element 16 may be provided with blind holes or recesses 20a instead of through-holes. Further, the ends of the slots 20b formed through the magnetic shim element 16 may be rounded, as shown in FIG. 5. Alternatively, as shown in FIG. 6, the magnetic shim element 16 may be provided with triangular slots 20c instead of rectangular slots.

Furthermore, a plurality of slots exhibiting distinct end angles and dimensions may be formed in a magnetic shim element 16 such that a plurality of corrective field components can be generated by the shim elements of the same form and dimension.

What is claimed is:

1. A magnetic field correction device for enhancing a uniformity of a magnetic field generated in a uniform field region by a magnet, comprising:

a plurality of plate-shaped magnetic shim elements for generating a corrective field, said shim elements being disposed parallel to each other at a predetermined radius from a center of said uniform field region and at predetermined circumferential angles around said center, wherein one or more of said shim elements is each provided with two or more slots symmetrically formed with respect to a central plane in said shim elements, said shim elements having said two or more slots generating a first predetermined corrective field component of said corrective field generated by said plurality of shim elements in said uniform field region, wherein the first predetermined corrective field component is based on the size of said two or more slots relative to the size of said shim elements.

2. A magnetic field correction device as claimed in claim 1, wherein said plate-shaped shim elements have an equal length, thickness and width.

3. A magnetic field corrective device as claimed in claim 1, wherein at least one of said shim elements is provided with two or more slots asymmetrically formed with respect to the central plane in said shim elements for generating a second predetermined corrective field component of said corrective field generated by said plurality of shim elements, wherein the second predetermined corrective field component is based on the size of the two or more slots relative to the size of said shim elements.

4. A magnetic field corrective device as claimed in claim 1, wherein said circumferential angles include π/2 (±½ ±⅓ ±¼).

5. A magnetic field corrective device as claimed in claim 3, wherein the ratio of the width of said shim elements with respect to the width of said slots is predetermined in order to generate said first and second predetermined corrective field components.

6. A magnetic field corrective device as claimed in claim 3, wherein ends of said slots are rounded.

7. A magnetic field corrective device as claimed in claim 1, wherein said slots are triangular shaped.

8. A magnetic field correction device for enhancing a uniformity of a magnetic field generated in a uniform field region by a magnet, comprising:

a plurality of plate-shaped magnetic shim elements for generating a corrective field, said shim elements being disposed parallel to each other at a predetermined radius from a center of said uniform field regions and at predetermined circumferential angles around said center, where in one or more of said shim elements is each provided with two or more recesses symmetrically formed with respect to a central plane in said shim elements, said shim elements having said two or more recesses generating a predetermined corrective field component of said corrective field generated by said plurality of shim elements in said uniform field region, wherein the predetermined corrective field component is based on the size of said two or more recesses relative to the size of said shim elements.

9. A magnetic field corrective device as claimed in claim 1, wherein at least one of said shim elements is provided with at least one slot symmetrically formed with respect to a central plane in said shim element, and with at least one slot asymmetrically formed in said shim element.

10. A magnetic field corrective device as claimed in claim 1, wherein the longitudinal axis intersecting each of said two or more slots of said one or more shim elements is parallel to the axis of said magnet which generate the magnetic field.

* * * * *